(12) United States Patent
Guven et al.

(10) Patent No.: US 6,919,512 B2
(45) Date of Patent: Jul. 19, 2005

(54) FIELD WELDABLE CONNECTIONS

(75) Inventors: Oguzhan Guven, Houston, TX (US); Harjit S. Kohli, Sugar Land, TX (US)

(73) Assignee: Schlumberger Technology Corporation, Sugar Land, TX (US)

( * ) Notice: Subject to any disclaimer, the term of this patent is extended or adjusted under 35 U.S.C. 154(b) by 0 days.

(21) Appl. No.: 10/449,469

(22) Filed: May 30, 2003

(65) Prior Publication Data

US 2003/0192707 A1 Oct. 16, 2003

Related U.S. Application Data

(63) Continuation-in-part of application No. 09/970,353, filed on Oct. 3, 2001.

(51) Int. Cl.$^7$ ................................................ H10R 4/00
(52) U.S. Cl. ..................................................... 174/84 R
(58) Field of Search ............................ 174/74 R, 77 R, 174/79, 84 R, 85, 88 R, 88 C, 91, 92

(56) References Cited

U.S. PATENT DOCUMENTS

| | | | |
|---|---|---|---|
| 607,018 A | | 7/1898 | Connelly |
| 2,893,758 A | | 7/1959 | Dufour et al. |
| 3,145,421 A | | 8/1964 | Colbert |
| 3,325,191 A | | 6/1967 | Yates |
| 3,846,578 A | | 11/1974 | Bahder et al. |
| 4,403,110 A | | 9/1983 | Morrisette |
| 4,407,065 A | * | 10/1983 | Gray ........................... 29/828 |
| 4,484,022 A | | 11/1984 | Eilentropp |
| 4,501,927 A | | 2/1985 | Sievert |
| 4,549,039 A | | 10/1985 | Charlebois et al. |
| 4,580,874 A | * | 4/1986 | Winter et al. ................. 385/99 |
| 4,627,490 A | | 12/1986 | Moore |
| 4,634,040 A | | 1/1987 | Savard |
| 4,653,541 A | | 3/1987 | Oehlschlaeger et al. |
| 4,839,470 A | | 6/1989 | Ventura |
| 4,943,685 A | * | 7/1990 | Reynaert ..................... 174/19 |
| 4,968,857 A | | 11/1990 | McGrane |
| 4,976,796 A | * | 12/1990 | Feitzelmayer ................ 156/49 |
| 5,006,286 A | | 4/1991 | Dery et al. |
| 5,265,790 A | | 11/1993 | Mumford, III et al. |
| 5,315,065 A | | 5/1994 | O'Donovan |
| 5,422,456 A | | 6/1995 | Dahm |
| 5,509,202 A | | 4/1996 | Abdow |
| 5,563,391 A | | 10/1996 | Dahm |
| 5,781,995 A | | 7/1998 | Anna et al. |
| 5,844,190 A | | 12/1998 | Benway et al. |
| 6,172,304 B1 | | 1/2001 | Laurent et al. |
| 6,442,304 B1 | | 8/2002 | Crawley et al. |

* cited by examiner

*Primary Examiner*—William H. Mayo, III
(74) *Attorney, Agent, or Firm*—Trop, Pruner & Hu PC; Kevin McEnaney; Jaime A. Castaño

(57) ABSTRACT

The present invention provides a field weldable connection. In one embodiment, the field weldable connection is a downhole connector assembly for sealingly attaching a first and a second segment of a control line. The control line has an outer housing that encapsulates a polymeric secondary housing. A communication line runs therethrough the secondary housing. The connector further comprises a weld coupling welded to the outer housing of the first and second segments of the control line. To protect the communication line from the thermal radiation and heat generated during the welding process, at least one reflective sleeve replaces a portion of the secondary housing at a location intermediate the communication line and the welds of the coupling.

34 Claims, 9 Drawing Sheets

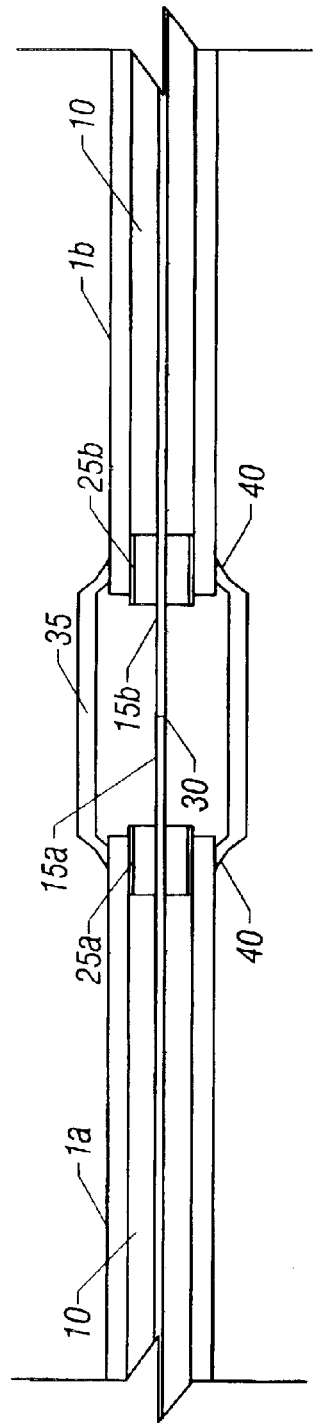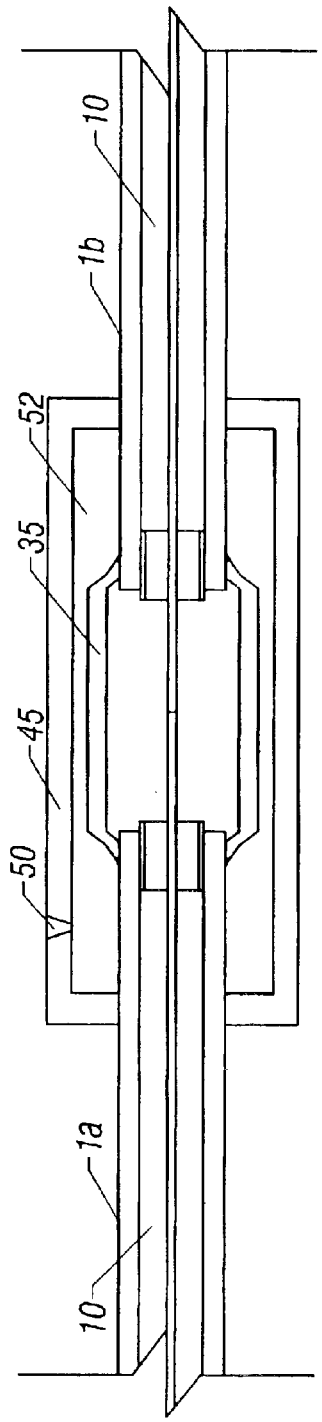

FIELD WELDABLE CONNECTIONS

This application is a continuation-in-part of pending U.S. application Ser. No. 09/970,353 filed Oct. 3, 2001.

FIELD OF THE INVENTION

The subject matter of the present invention relates to communication lines. More specifically, the subject matter of the present invention relates to an apparatus and method of protecting and sealing spliced communication lines.

BACKGROUND OF THE INVENTION

Communication lines are used in a wide range of applications in the oilfield industry. The communication lines transmit monitored data regarding downhole conditions such as temperature and pressure to surface instrumentation. The communication lines can also be used to send information down the well from the surface. Additionally, communication lines may also be used to electrically power downhole equipment. Communication lines may include electrical conduits, optical fibers, and other methods for data or power transmission.

In environments such as those encountered in downhole wells, the communication lines are exposed to hostile conditions such as elevated temperatures and pressures. To protect the fragile communication lines from the hostile conditions, the communication lines are generally carried within protective tubing that provides an environmental seal. Problems arise when the seal must be broken during assembly, installation and/or repair of the communication line. For example, in downhole applications, in order for the communication line to be fed through production equipment such as packers, the line must be cut and then spliced with the downstream line. Thus, after splicing, the communication line must once again be sealed from the harsh environment.

There exists, therefore, a need for an apparatus and method of splicing communication lines that provides structural integrity and protects the communication line from the surrounding environment.

SUMMARY OF THE INVENTION

An embodiment of the present invention provides a downhole connector assembly for sealingly attaching a first and a second segment of a control line. The control line has an outer housing that encapsulates a polymeric secondary housing having a communication line therein. The connector assembly comprises at least one weld coupling welded to the outer housing of the first and second segment of the control line. At least one reflective sleeve replaces at least a portion of the secondary housing such that the reflective sleeve is located between the communication line and the welds of the weld coupling.

BRIEF DESCRIPTION OF THE DRAWINGS

FIG. 3 is a sketch of the welded splice assembly.

FIG. 4 is a sketch of another embodiment of the welded splice assembly having a pressure housing.

DETAILED DESCRIPTION OF PREFERRED EMBODIMENTS

In the following detailed description of the subject matter of the present invention, the apparatus and method of splicing communication lines is principally described with reference to downhole well applications. Such description is intended for illustration purposes only and is not intended to limit the scope of the present invention. In addition to downhole well applications, the present invention can be used with any number of applications such as pipeline monitoring, subsea well monitoring, and data transmission, for example. Furthermore, the communication lines may comprise electrical wiring, which may facilitate transfer of information, power, or both. All such types of communication line splicing are intended to fall within the purview of the present invention. However, for purposes of illustration, the present invention will be principally described as being used in downhole well applications. Further as used herein, the term communication line shall refer to those lines comprising electrical lines or fiber optic lines, as well as lines including combinations thereof or combinations with other types of lines.

Figure 1:
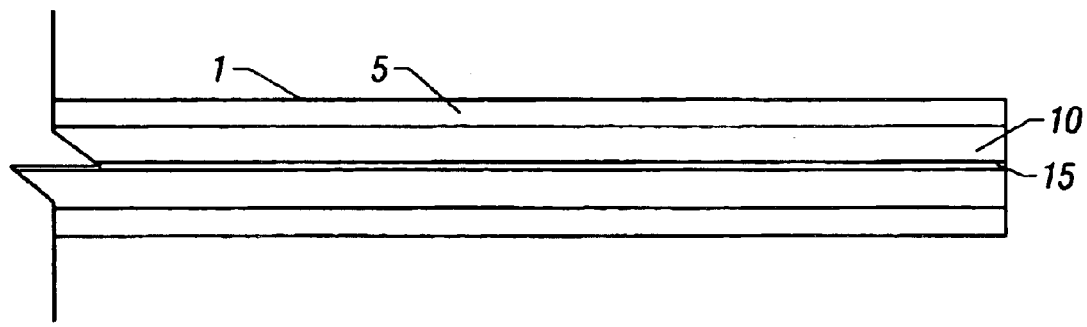
FIG. 1 is a sketch of a communication cable.

FIG. 1 provides a sketch of a typical cable 1 useful in the present invention. The cable 1 comprises an outer housing 5, a secondary housing 10, and one or more communication lines 15. The outer housing 5 provides the structural integrity for the cable 1 and protects the communication lines 15 from the surrounding environment. Further, the outer housing 5 provides structural protection for the communication lines 15 from damage caused by the cable 1 impacting, or being impacted by, nearby tools and equipment. In one embodiment, the outer housing 5 is comprised of a metallic material such as steel, or other metallic alloys, for example. The secondary housing 10 resides within the outer housing 5 and provides protection for the communication lines 15 contained within. In one embodiment, shown in FIG. 1, the secondary housing 10 is made from a polymeric material.

Figure 2:
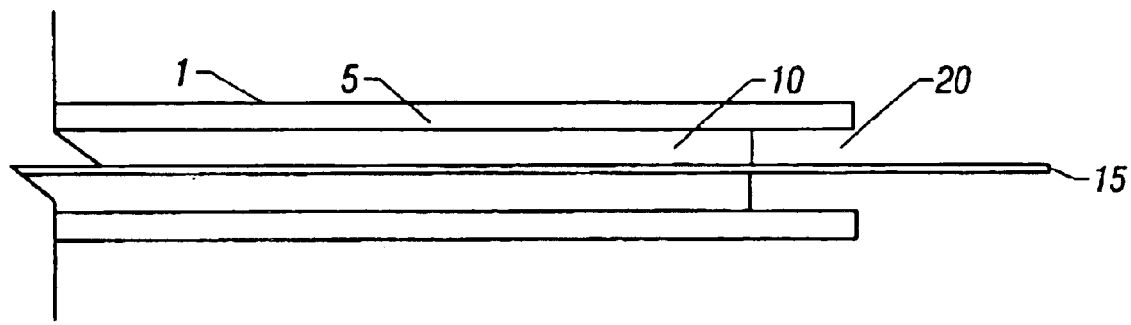
FIG. 2 is a sketch of a section of cable that has been prepared for splicing.

FIG. 2 provides a sketch of a segment of cable that has been prepared for splicing. The cable 1 has been cut so that the communication line 15 extends longitudinally beyond the outer housing 5 and the secondary housing 10. Afterwards, a portion of the secondary housing 10 is removed in order to create a void 20, which is defined by the outer housing 5 and the secondary housing 10.

FIG. 3 provides a sketch illustrating the communication line splice of the present invention. In FIG. 3, the two communication lines being spliced are designated 15a and 15b. Once the cables 1a, 1b have been prepared for splicing, thermal insulators 25a, 25b are inserted into the void 20 (shown in FIG. 2) so that the insulators 25a, 25b lie between the outer housing 5 and the communication lines 15a, 25b. The insulators 25a, 25b protect the communication lines 15a, 15b from the heat of the welding. Additionally, the insulators 25a, 25b prevent the secondary housing from melting and outgassing, which can result in poor weld quality. Prior to splicing, a weld coupling 35 is slid over one of the cables 1a, 1b. The cleaved communication lines 15a, 15b are then spliced together by conventional techniques, such that the communication lines 15a, 15b are operatively connected at the splice 30. The weld coupling 35 is then slid to cover the ends of both cables 1a, 1b, and the weld coupling 35 is secured in place by welds 40. In one embodiment the welds 40 are formed using an orbital welder. Once welded, the weld coupling 35 protects the splice 30 from corrosion, erosion, and physical damage resulting from environmental and operational conditions. Additional protection is provided against hydrocarbon darkening resulting from contact with conductive fluid.

FIG. 4 provides a sketch of another embodiment of the weld assembly. In this embodiment, a pressure housing 45 fits over the weld coupling 35. The pressure housing 45 is slid over the same cable 1a, 1b as the weld coupling 35, but is slid prior to the sliding of the weld coupling 35. After splicing and after the weld coupling 35 is secured in place, the pressure housing 45 is attached to the cables 1a, 1b such that the weld coupling 35 is isolated from environmental conditions. For example the housing may be attached by welding, ferrules, or elastomeric seals, among other means. A port 50, located in the pressure housing 45 enables pressure testing of the welded assembly.

Figure 5:
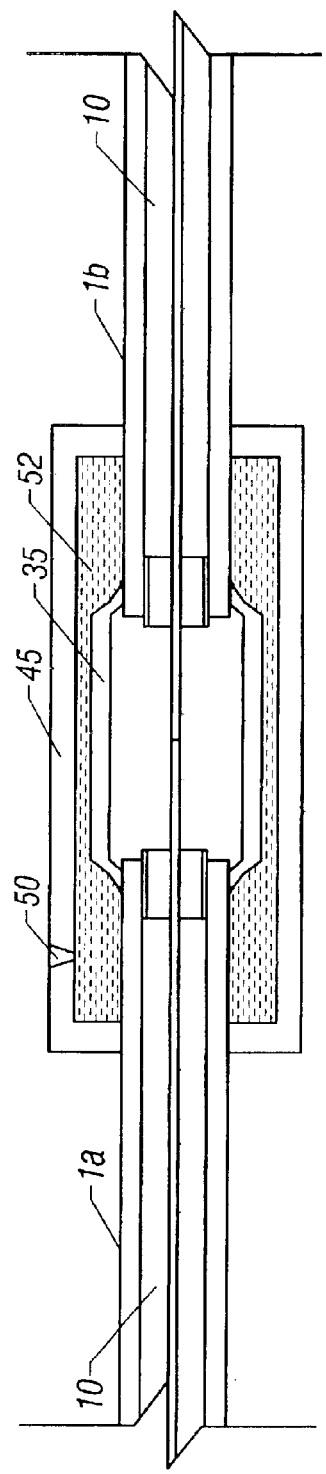
FIG. 5 is a sketch of another embodiment of the welded splice assembly having a gel or epoxy material within the pressure housing.

FIG. 5 provides a sketch of another embodiment of the weld assembly. In this embodiment a gel or epoxy material is pumped through the port into a cavity 52 defined by the pressure housing 45, the cables 1a, 1b, and the weld coupling 35. This fluid is used for pressure testing. The fluid is pumped into the cavity 52 at a high pressure, and the welded splice assembly is monitored for signs of failure. After pumping, the port 50 is plugged to seal in the viscous fluid. When the spliced section of cable is installed downhole, the viscous fluid cures and hardens due to the high downhole temperatures. The cured material thus provides additional protection for the splice 30 against erosion, corrosion, and other environmental conditions.

Figure 6:
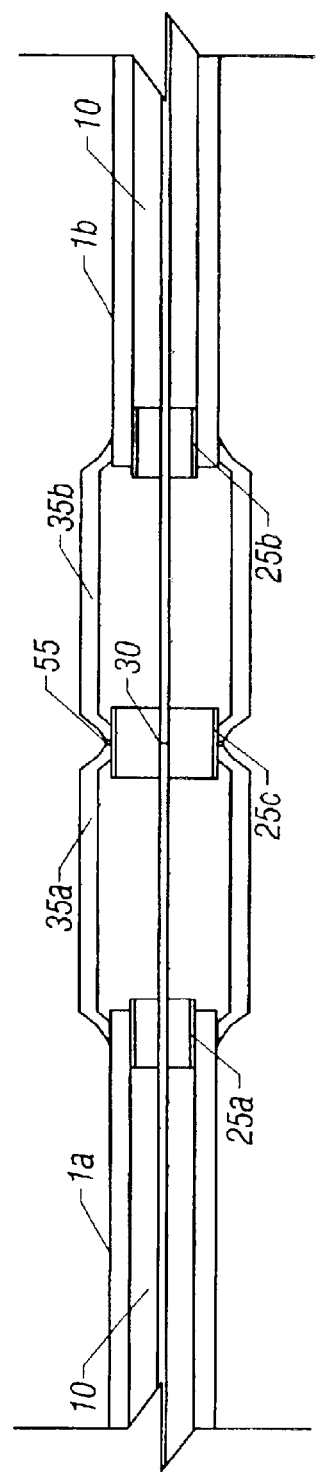
FIG. 6 is a sketch of another embodiment of the welded splice assembly having a plurality of weld couplings.

FIG. 6 provides a sketch of another embodiment of the weld assembly having a plurality of weld couplings 35a, 35b. The embodiment shown in FIG. 6 shows two couplings, but any number can be used and remain within the purview of the invention. The first weld coupling 35a is slid over the first cable 1a and the second weld coupling 35b is slid over the second cable 1b. An additional thermal insulator 25c is inserted to protect the splice 30 at the housing junction 55. After the cables 1a, 1b are spliced, the first weld coupling 35a is welded to the first cable 1a and the second weld coupling 35b is welded to the second cable 1b. The first weld coupling 35a is then welded to the second weld coupling 35b at the housing junction 55, thereby enclosing the splice 30.

In this manner, both welds near the secondary housing 10 are formed prior to the weld couplings 35a, 35b being sealed to the surrounding environment. Thus, any resulting outgassing of the secondary housing 10 is able to escape to the environment and does not affect the weld quality.

Figure 7:
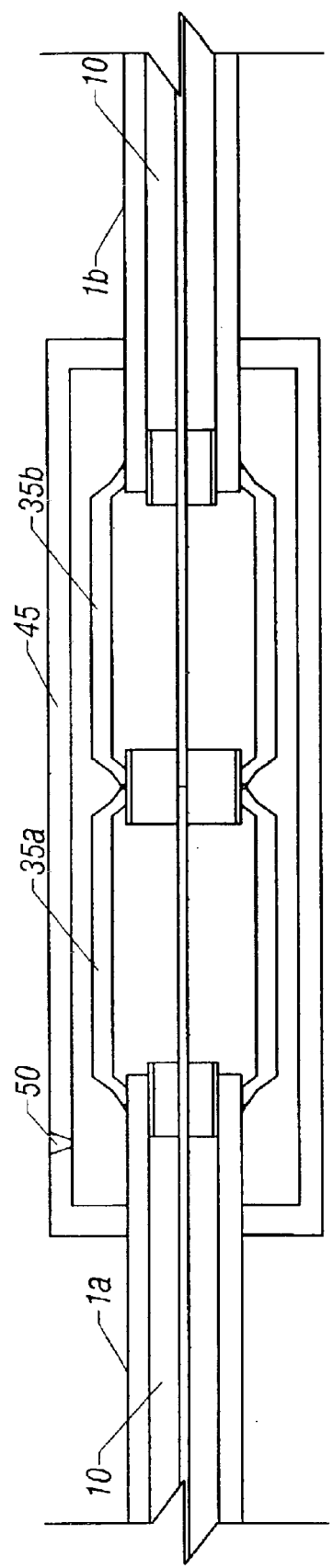
FIG. 7 is a sketch of another embodiment of the welded splice assembly having a plurality of weld couplings and a pressure housing.

FIG. 7 provides a sketch of another embodiment of the weld assembly. In this embodiment, the pressure housing 45 protects the two weld couplings 35a, 35b against erosion and other damaging environmental conditions. The pressure housing 45, through its port 50, enables testing of the welded connections with a standard fluid for pressure testing, such as hydraulic oil, or by a different viscous fluid, such as a gel or epoxy material.

Figure 8:
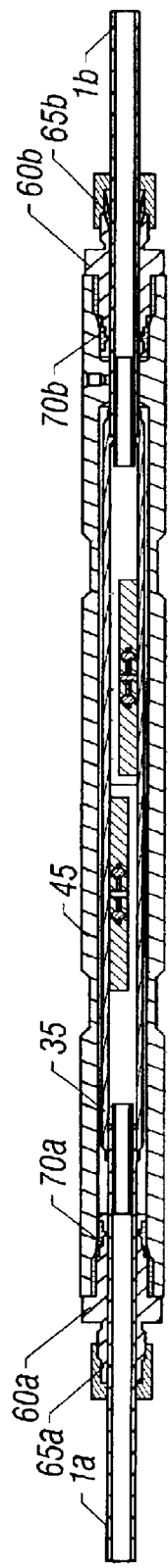
FIG. 8 is a sketch of another embodiment of the welded splice assembly.

FIG. 8 provides a sketch of another embodiment of the pressure housing 45. In this embodiment, the pressure housing 45 is attached to the cables 1a, 1b by means of fittings 60a, 60b. The first fitting 60a and the pressure housing 45 are slid over the first cable 1a. The second fitting 60b is slid over the second cable 1b. After splicing, the fittings 60a, 60b and the pressure housing 45 are positioned such that the weld coupling 35 is contained within the pressure housing 45. The fittings 60a, 60b are then tightened, thereby sealing the welded connections inside the pressure housing 45. The fittings 60a, 60b in this embodiment seal to the cables 1a, 1b through a dual ferrule systems 65a, 65b. The fittings 60a, 60b seal onto the pressure housing 45 by means of an elastomeric seals 70a, 70b. These sealing mechanisms 65a, 65b, 70a, 70b are not the only means by which the seals can be made. All mechanisms by which one could sealingly join the pressure housing 45 and the cables 1a, 1b are intended to fall within the purview of the present invention.

Figure 9:
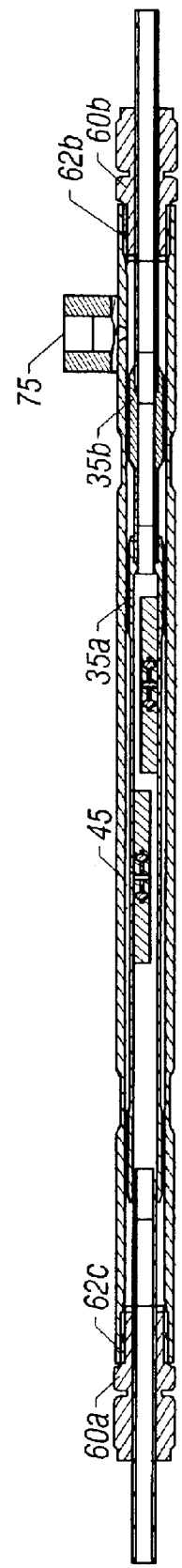
FIG. 9 is a sketch of another embodiment of the welded splice assembly having a plurality of weld couplings.

FIG. 9 provides a sketch of another embodiment of the splice assembly. In this embodiment, the fittings 60a, 60b are connected to pressure housing 45 by means of a sealing pipe threads 62b, 62c. A removable port 75 is used to pressure test the welded splice assembly.

Figure 10:
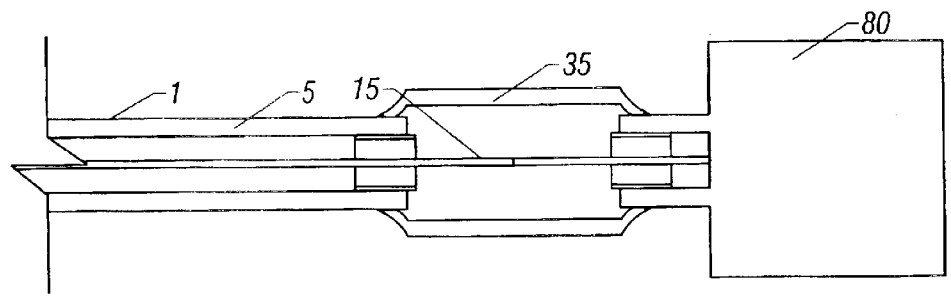
FIG. 10 is a sketch of another embodiment of the welded splice assembly attached to a tool.

FIG. 10 provides a sketch of another embodiment of the splice assembly. In this embodiment, communication line 15 is spliced to a downhole tool 80. The weld coupling 35 is welded to the outer housing 5 on one side and a section of the tool 80 on the opposite side.

Figure 11:
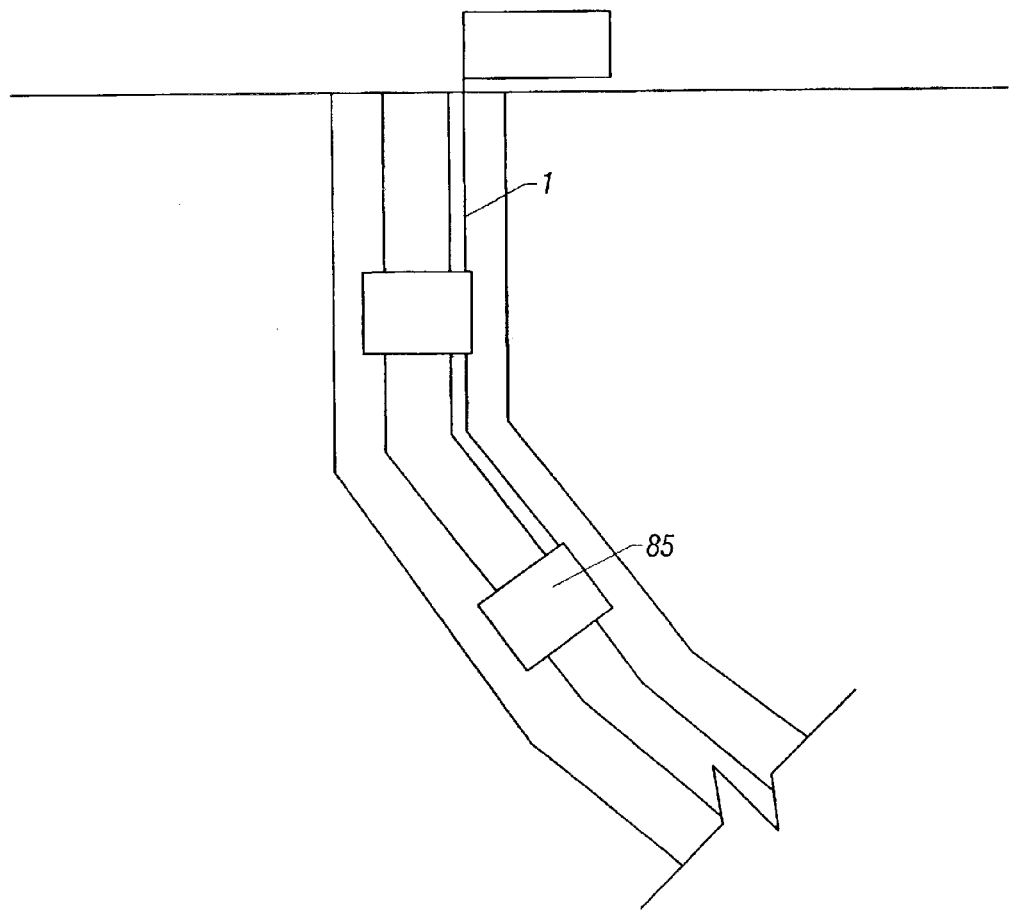
FIG. 11 is a sketch of a wellbore completion including a spliced communication line.

FIG. 11 provides a sketch of a wellbore completion including a spliced communication line. The cable 1 is installed downhole to communicate with or power a piece of downhole equipment 85. The equipment 85 may be controlled by a controller located at the surface.

Figure 12:
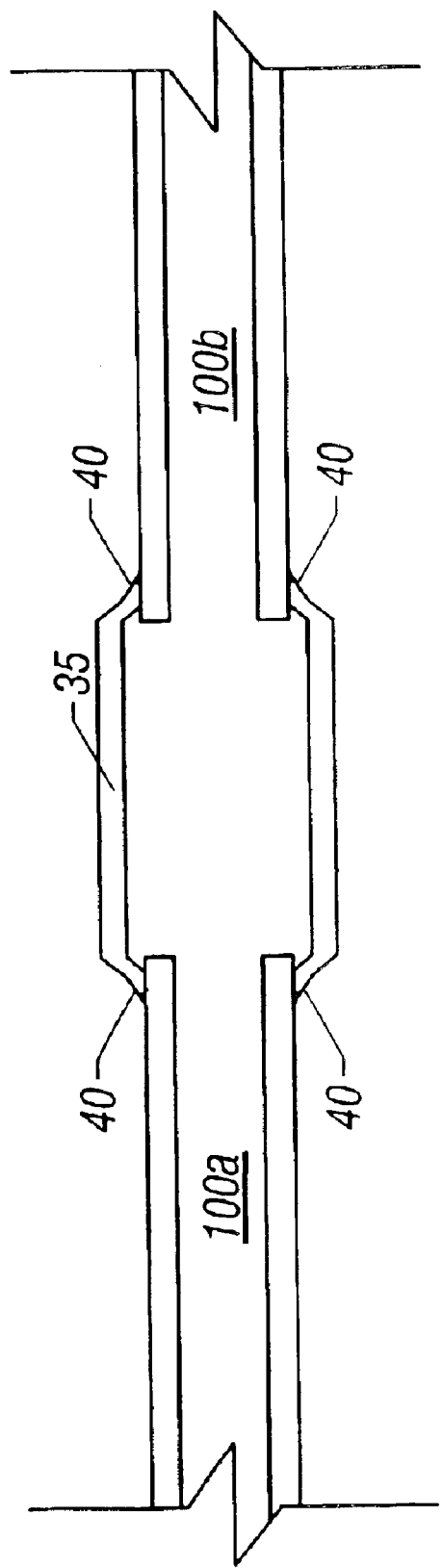
FIG. 12 provides a sketch of the welded splice assembly used for a hydraulic or fluid conduit.

FIG. 12 provides a sketch of the welded splice assembly used for a hydraulic or fluid conduit. In FIG. 12, a weld coupling 35 is secured over the spliced hydraulic or fluid conduits 100a,100b by welds 40. Once welded, the resulting spliced hydraulic or fluid line can be pressure tested prior to placement downhole.

Figure 13:
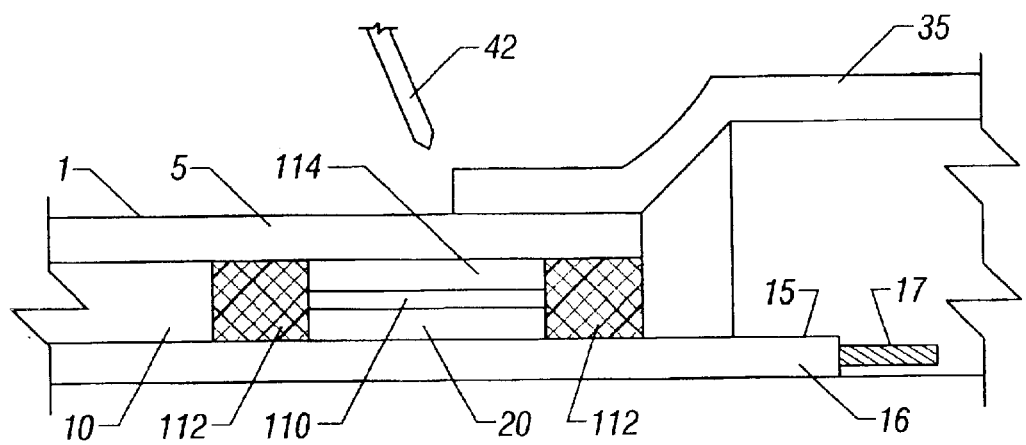
FIG. 13 provides a sketch of another embodiment of the welded splice assembly of the present invention having a reflective shield.

Another embodiment of the welded splice assembly of the present invention is described with reference to FIG. 13 that provides a partial sketch of a segment of cable 1 that has been prepared for splicing. In this embodiment, a small reflective sleeve 110 is inserted into the void 20 between the communication line 15 and the outer housing 5. The reflective sleeve 110 can be comprised of material such as aluminum or steel, or can be coated with a reflective material.

The reflective sleeve 110 and the communication line 15 are centered inside the outer housing 5 with the use of centralizers 112. By using the centralizers 112, a substantially uniform air gap 114 is created that provides insulation around the communication line 15. The centralizers 112 are preferably made of a non-electrically conductive material that does not out-gas when exposed to high temperatures. An appropriate material for use as the centralizers 112 is PEEK, for example.

The communication line 15 is spliced and the weld coupling 35 is welded to the outer housing 5 of the cable 1 using a welding electrode 42, as described with previous embodiments. As discussed above, the weld coupling 35 protects the splice from corrosion, erosion, and physical damage resulting from environmental and operational conditions.

During the welding process, the reflective sleeve 110 protects the insulation 16 and conductor 17 of the communication line 15 from the heat of the welding. For example, in the case of optical communication lines, the optical fibers are protected. Additionally, at extreme temperatures, the reflective sleeve 110 protects the insulation 16 of the communication line 15 from thermal radiation, which can be the primary means of heat transfer at extreme high temperatures.

A pressure housing, as detailed in earlier described embodiments (e.g., FIGS. 4, 5, 7, 8, and 9) can be provided for pressure testing the splice assembly and for isolating the weld coupling from environmental conditions.

Figure 14:
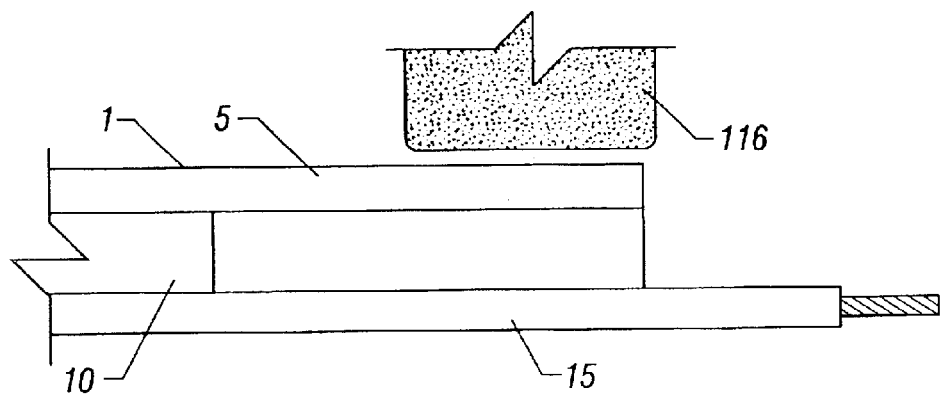
FIG. 14 provides a sketch illustrating another embodiment of the welded splice assembly of the present invention.

FIG. 14 provides an illustrative sketch of an embodiment of the welded splice assembly of the present invention that provides a method adapted to protect the welded splice assembly against problems associated with having air trapped within the weld coupling 35. As discussed above, after the splice 30 is made, the weld coupling 35 is slid over the connection and welded to the outer housing 5 of the cable 1. During the welding of the first end of the weld coupling 35, the opposite end of the weld coupling 35 is open and thus provides a means for equalization of air pressures. However, during the welding of the second end of the weld coupling 35, problems associated with trapped air can arise. For example, as the electrode 42 moves into the last part of the cross-section of the weld coupling 35 and attempts to trap the air, the expansion of the air caused by the continuous addition of heat can cause a hole to be formed in the weld pool.

As shown in FIG. 14, a grinding or honing wheel 116 is provided to uniformly remove material off of the surface of the outer housing 5 of the cable 1. The resulting cable 1 has a circular cross-section in which the outer housing 5 has a substantially uniform outside diameter. Thus, a tighter fit with a smaller inner diameter weld coupling 35 can be achieved. By having very close contact between the two welded surfaces, the expansion of air through the last part of the weld pool can be prevented.

Figure 15:
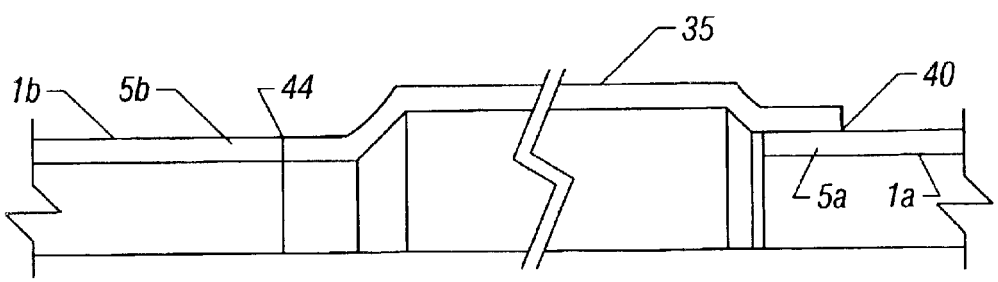
FIG. 15 provides a sketch of yet another embodiment of the welded splice assembly of the present invention.

FIG. 15 provides an illustrative sketch of another embodiment of the welded splice assembly of the present invention adapted to protect the welded splice assembly against problems associated with having air trapped within the weld coupling 35. In this embodiment, after welding the first end of the weld coupling 35 to the outer housing 5 of the first cable 1a with a fillet weld 40, the second end of the weld coupling 35 is welded to the outer housing 5b of the second cable 1b with a butt weld 44.

At the butt weld 44, the two faces of the weld 44 can have a very tight fit. Provided the weld penetration is not too deep, the molten weld pool can be prevented from contacting the expanding air and causing a defect. The butt weld 44 can be performed using facing tools that are commonly used for butt welding hydraulic tubing but specially adapted to accommodate and protect the communication line 15 during the metal removal operation.

Figure 16:
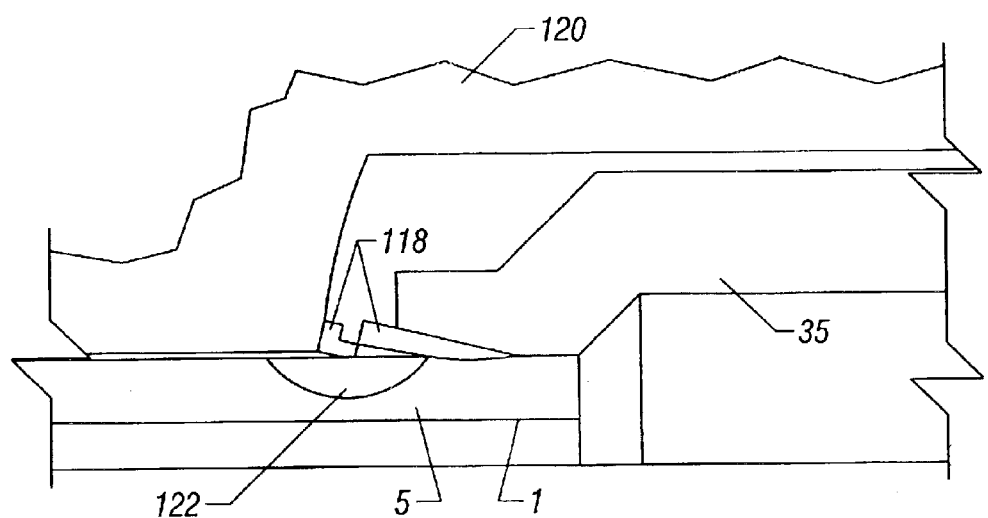
FIG. 16 provides a sketch of still another embodiment of the welded splice assembly of the present invention.

FIG. 16 provides an illustration of another embodiment of the welded splice assembly of the present invention adapted to protect the welded splice assembly against problems associated with having air trapped within the weld coupling 35. In this embodiment, compression fittings such as ferrules 118 are used on the end of the weld coupling 35. The ferrules 118 can be of the type used to create metal-metal seals on small diameter tubing, for example.

The ferrules 118 are swaged onto the end of the weld coupling 35, creating a metal-metal seal between the weld coupling 35 and the ferrules 118 and between the ferrules 118 and the outer housing 5 of the cable 1. The swaging nut 120 is built split to be removable from the cable 1 after swaging. Provided the weld electrode is properly positioned, the entrapped air is isolated from the weld pool 122 by the metal-metal seal, preventing the forming of defects. As before, only the second end of the weld coupling 35 needs to use the ferrules prior to welding.

Figure 17:
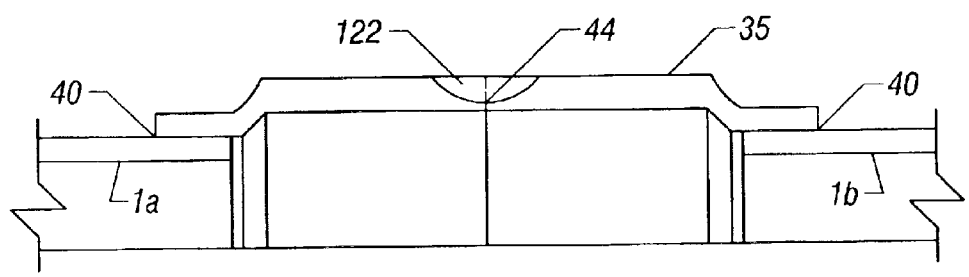
FIG. 17 provides a sketch of still another embodiment of the welded splice assembly of the present invention.

FIG. 17 provides an illustrative sketch of yet another embodiment of the welded splice assembly of the present invention adapted to protect the welded splice assembly against problems associated with having air trapped within the weld coupling 35. In this embodiment, a two-piece weld coupling 35 is used. The two ends of the two-piece weld coupling 35 are first welded to the cables 1a, 1b with fillet welds 40. Because the other end of each half of the two-piece weld coupling 35 is open, no air entrapment occurs during application of the fillet welds 40.

The two halves of the weld coupling 35 are then welded together using a butt weld 44. The two faces of the halves of the two-piece weld coupling 35 have the required finish and geometry to prevent air escape during the welding process. The weld penetration is selected to be less than full to prevent the weld pool 122 from coming in contact with the expanding air. The wall of the weld coupling 35 and the resultant penetration are designed so that the resultant assembly has the required collapse strength.

It should be noted that the above embodiments described with reference to FIGS. 14 through 17 can be used to advantage with any of the earlier described embodiments of the welded splice assembly. The methods and apparatus used to protect against problems associated with having air trapped within the weld coupling 35 can be used to advantage in embodiments employing thermal insulators or reflective sleeves.

The invention being thus described, it will be obvious that the same may be varied in many ways. Such variations are not to be regarded as a departure from the spirit and scope of the invention, and all such are intended to be included within the scope of the following non-limiting claims:

What is claimed is:

1. A downhole connector assembly for sealingly attaching a first segment and a second segment of a control line having an outer housing that encapsulates a polymeric secondary housing having a communication line therein that extends therefrom, comprising:

at least one weld coupling welded to the outer housing, said at least one weld coupling comprising welds; and at least one reflective sleeve located between the communication line and the welds of said at least one weld coupling, wherein an insulating gap is located between said at least one reflective sleeve and the welds of said at least one weld coupling.

2. The downhole connector assembly of claim 1, wherein the reflective sleeve is made of material adapted to protect the communication line from thermal radiation created during the welding of said at least one weld coupling.

3. The downhole connector assembly of claim 1, wherein the insulating gap comprises a substantially uniform air gap and the reflective sleeve further comprises centralizers adapted to create the substantially uniform air gap.

4. The downhole connector assembly of claim 3, wherein the centralizers are made of a non-electrically conductive material.

5. The downhole connector assembly of claim 4, wherein the non-electrically conductive material is PEEK.

6. The downhole connector assembly of claim 1, further comprising a protective housing containing the at least one weld coupling therein.

7. The downhole connector assembly of claim 6, wherein the protective housing is filled with an epoxy.

8. The downhole connector assembly of claim 6, wherein the protective housing is filled with a gel.

9. The downhole connector assembly of claim 6, wherein the protective housing further comprises a port adapted for pressure testing the downhole connector assembly.

10. The downhole connector assembly of claim 1, wherein the communication line comprises an electrical line.

11. The downhole connector assembly of claim 1, wherein the communication line comprises a fiber optic line.

12. The downhole connector assembly of claim 1, wherein said at least one reflective sleeve comprises a metallic material.

13. The downhole connector assembly of claim 1, wherein said at least one reflective sleeve comprises an electrically conductive material.

14. The downhole connector assembly of claim 1, wherein at least part of said at least one reflective sleeve is located between the communication line and at least part of said at least one weld coupling along a path extending radially from a longitudinal axis of the communication line.

15. The downhole connector assembly of claim 1, wherein said at least one reflective sleeve at least partially circumscribes a longitudinal axis of the communication line and said at least one weld coupling at least partially circumscribes said at least one reflective sleeve.

16. A protective splice assembly, comprising:
    a first cable having an outer housing and a polymeric secondary housing having a communication line therein;
    a second cable having an outer housing and a polymeric secondary housing having a communication line therein;
    a spliced connection between the communication lines of the first and second cables;
    at least one weld coupling located between the outer housings and the communication lines welded to the outer housings of the first and second cables; and
    at least one reflective sleeve of the first and second cables replacing at least a portion of the polymeric secondary housings of the first and second cables, and located intermediate the welds of said at least one weld coupling and the communication lines,
    wherein an insulating gap is located between said at least one reflective sleeve and said at least one weld coupling.

17. The protective splice assembly of claim 16, wherein said at least one reflective sleeve comprises a material adapted to protect the communication lines from thermal radiation generated during the welding of said at least one weld coupling.

18. The protective splice assembly of claim 16, wherein the insulating gap comprises a substantially uniform air gap, the protective splice assembly further comprising centralizers adapted to create the substantially uniform air gap.

19. The protective splice assembly of claim 16, adapted for downhole application.

20. The protective splice assembly of claim 16, wherein the communication lines transfer data.

21. The protective splice assembly of claim 16, wherein the communication lines transfer power.

22. The protective splice assembly of claim 16, wherein the communication lines comprise electrical lines.

23. The protective splice assembly of claim 16, wherein the communication lines comprise fiber optic lines.

24. The protective splice assembly of claim 16, further comprising a pressure housing secured to the first and second cables such that the at least one weld coupling is isolated from the surrounding environment.

25. The protective splice assembly of claim 24, wherein the pressure housing further comprises a port adapted for pressure testing.

26. The protective splice assembly of claim 24, wherein the pressure housing is filled with a gel.

27. The protective splice assembly of claim 24, wherein the pressure housing is filled with an epoxy.

28. The protective splice assembly of claim 16, wherein said at least one reflective sleeve comprises a metallic material.

29. The protective splice assembly of claim 16, wherein said at least one reflective sleeve comprises an electrically conductive material.

30. The protective splice assembly of claim 16, wherein at least part of said at least one reflective sleeve is located between at least one of the communication lines and at least part of said at least one weld coupling along a path extending radially from a longitudinal axis of said at least one communication line.

31. The protective splice assembly of claim 16, wherein said at least one reflective sleeve at least partially circumscribes a longitudinal axis of at least one of the communication lines and said at least one weld coupling at least partially circumscribes said at least one reflective sleeve.

32. A downhole connector assembly for sealingly attaching a first and a second segment of a control line having a polymeric secondary housing having a communication line therein, comprising:
    at least one weld coupling; and
    means for protecting the communication line from thermal radiation, said means replacing a portion of the polymeric secondary housing, said means located between the communication line and said at least one weld coupling and thermally insulated from said at least one weld coupling.

33. The downhole connector assembly of claim 32, wherein said means for protecting comprises a metallic material.

34. The downhole connector assembly of claim 32, wherein said means for protecting comprises an electrically conductive material.

* * * * *